United States Patent [19]

Uchida

[11] 4,044,343
[45] Aug. 23, 1977

[54] NON-VOLATILE RANDOM ACCESS MEMORY SYSTEM

[75] Inventor: Yukimasa Uchida, Yokohama, Japan

[73] Assignee: Tokyo Shibaura Electric Co., Ltd., Kawasaki, Japan

[21] Appl. No.: 681,557

[22] Filed: Apr. 29, 1976

[30] Foreign Application Priority Data

May 2, 1975 Japan .................................. 50-52494

[51] Int. Cl.$^2$ ............................................. G11C 11/40
[52] U.S. Cl. ........................ 340/173 R; 340/173 FF; 307/279
[58] Field of Search ..... 340/173 R, 173 CA, 173 FF; 307/238, 279

[56] References Cited

U.S. PATENT DOCUMENTS 3,983,544  3/1977  Dennison et al. ............ 340/173 CA Primary Examiner—Terrell W. Fears
Attorney, Agent, or Firm—Oblon, Fisher, Spivak, McClelland & Maier

[57] ABSTRACT

A non-volatile random access memory system includes a memory array circuit having a plurality of unit non-volatile memory cells arranged in a matrix array. Each unit memory cell includes a flip-flop circuit and two MNOS transistors into which a data in the flip-flop is written and from which the data written therein is transferred to the flip-flop. The system also includes means for selecting a desired one of the unit memory cells and an input-output circuit adapted to supply a data to the selected unit cell and deliver the data read out of the selected unit cell. The system further includes a source voltage variation detector circuit adapted to deliver, when the source voltage for the memory array circuit is rendered ON, a control signal including a readout signal for reading the data in the MNOS transistors into the flip-flop or a source voltage variation detector circuit adapted to generate a control signal including a write signal for writing a data in the flip-flop circuit into the MNOS transistors when the source voltage is rendered OFF and a readout signal for reading the data in the MNOS transistors into the flip-flop circuit when the source voltage is rendered ON, and means for interrupting in synchronism with the control signal a data transfer path between the selected unit memory cell and the input-output circuit so as to prevent any influence from an external circuit when a data transfer is effected between the flip-flop circuit and the MNOS transistors.

4 Claims, 8 Drawing Figures

F I G. 5A
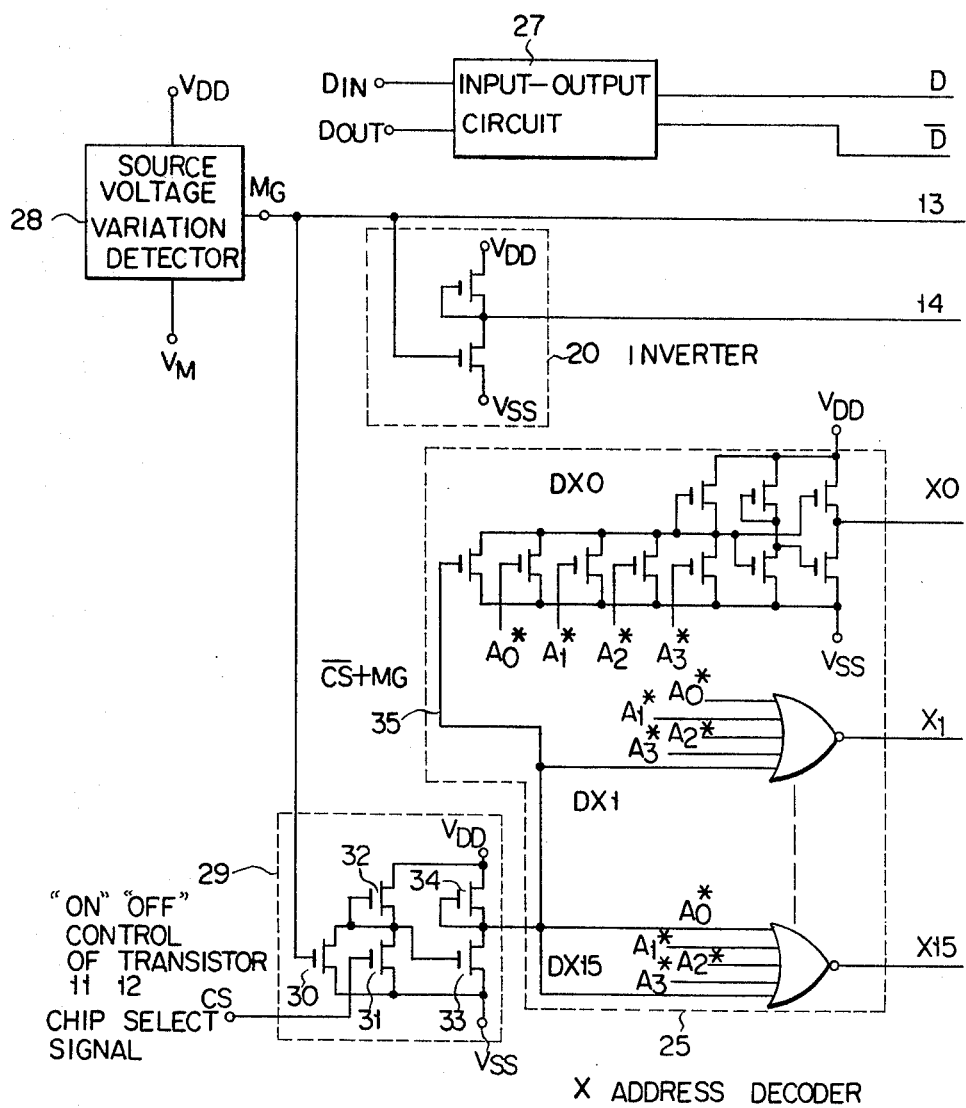

NON-VOLATILE RANDOM ACCESS MEMORY SYSTEM

BACKGROUND OF THE INVENTION

This invention relates to a non-volatile random access memory system and in particular a memory system capable of storing and holding a data as a non-volatile data under a stable condition when a source voltage is interrupted.

The non-volatile semiconductor memory device has such an excellent characteristic that even when a source voltage is interupted a data in each memory cell constituting the memory device is not erased. A variety of unit memory cells are known which constitute such a non-volatile semiconductor device. The example is shown in FIG. 1. The unit memory cell in FIG. 1 is disclosed in U.S. Pat. application Ser. No. 509,490 entitled "Non-volatile counter circuit" filed on September, 1974. In FIG. 1 a source voltage $V_{DD}$, signal $I_E$ and control signal $M_G$ are applied to a source voltage line 1, signal line 2 and control signal line 3, respectively, and a ground line 4 is maintained to a ground potential $V_{SS}$ (= 0V). Between the lines 1 and 4 are connected a first series circuit including a driving MOS transistor 6a, a parallel circuit of a MNOS (metal-nitride-oxide semiconductor) memory transistor 5a and switching MOS transistor 7a, and load MOS transistor 8a and a second series circuit including a load MOS transistor 6b, parallel circuit of a MNOS memory transistor 5b and switching MOS transistor 7b and load MOS transistor 8b. The gates of the MNOS transistors 5a and 5b are connected to the line 3 and the gates of the switching transistors 7a and 7b are connected to the line 2. The drains of the load transistors 8a and 8b are connected to the line 1 and the sources of the driving MOS transistors 6a and 6b are connected to the line 4.

A potential on a junction 9a connected to the gate of the transistor 6b corresponds to a data Q and a potential on a junction 9b connected to the gate of the transistor 6a corresponds to a data $\bar{Q}$. Suppose now that a voltage $V_{DD}$ (= −18V) is applied to the line 1 and a signal $I_E$ (= −18V) is supplied to the line 2. Then, the switching transistors 7a and 7b are rendered conductive. As a result, a circuit consisting of the MOS transistors 6a, 6b, 8a and 8b is operated as a flip-flop and the data Q and $\bar{Q}$ can be stored, as corresponding potentials, on the junctions 9a and 9b respectively. When the source voltage $V_{DD}$ is rendered OFF by a power source voltage variation detector circuit not shown (t3 in FIG. 3), a negative pulse, for example, of −25V with a width of 1 m sec. is applied to the line 3. If at this time the memory content of the flip-flop is Q = "1", a potential on the junction 9a is −15V (If the threshold voltage Vth of the transistor 7a is −3V, −18V − (−3V) = −15V) and a potential on the junction 9b is 0V. Since the channel potential of the MNOS transistor 5a is −15V and channel potential of the MNOS transistor 5b is 0V, the effective gate voltages (a difference in potential between the gate and source) of the MNOS transistors 5a and 5b are −10V and −25V, respectively.

FIG. 2 shows a hysteresis characteristic of a threshold voltage corresponding to the effective gate voltage of the MNOS transistors 5a and 5b. Of both the MNOS transistors beforehand set to a threshold voltage of +2V it is seen that the threshold voltage of the MNOS transistor 5b whose effective gate potential is −25V is set to −6V and that the threshold voltage of the MNOS transistor 5a whose effective gate voltage is −10V remains to be +2V.

When a negative voltage pulse of −25V with a width of 1 msec is applied to the line 3, if the memory content of the flip-flop is Q = "0" (or $\bar{Q}$="1"), the potential on the junction 9a is 0V and the potential on the junction 9b is −15V. In consequence, the threshold voltages of the MNOS transistors 5a and 5b are 6V and +2V, respectively. As will be evident from the above explanation, even when the source voltage is rendered OFF, the data Q and $\bar{Q}$ of the flip-flop are stored, in a non-volatile fashion, as threshold voltage in the MNOS transistors 5a and 5b, respectively.

FIG. 3 shows a relation of the source voltage $V_{DD}$ to the control signal $M_G$ which is in synchronism with the variation of the source voltage $V_{DD}$. Time $T_3$ corresponds to the "OFF" starting point of the source voltage. The nonvolatile data of the MNOS memory transistors 5a and 5b are shifted to the flip-flop circuit as follows: At the time when the source voltage becomes an "ON" state the source voltage $V_{DD}$ varies as shown in time t0 to t1. With the potential on the line 2 as a ground potential a ramp input (inclining input) varied at the same inclination as that of the variation of the source voltage at this time is applied as a readout signal to the line 3, while the switching transistors 7a and 7b are rendered conductive. Since in this case the threshold voltages of the MNOS transistors 5a and 5b are +2V and −6V, respectively, the junction 9a is at a negative potential i.e. a potential having a smaller absolute value from among [$M_G$ voltage −2 volt] and [$V_{DD}$ voltage]. On the other hand, the junction 9b is at a negative potential i.e. a potential having a smaller absolute value from among [$M_G$ voltage + 6 volt] and [$V_{DD}$ voltage]. Since the potential on the junction 9a is negative and greater in absolute value than the potential on the junction 9b, the MOS transistor 6b is rendered conductive earlier than the MOS transistor 6a and the MOS transistor is rendered nonconductive.

Suppose now that at time t1 the signal $M_G$ is set to be 0V and the potential $I_E$ on the line 2 is to be −18V. The MOS transistors 7a and 7b are rendered conductive. In consequence, the potential on the junction 9a can be at a level of −15V and the potential on the junction 9b at the level of 0V. Suppose that at the time the source voltage is rendered OFF the threshold voltages of the MNOS transistors are set to be −6V and +2V, respectively, that is, the MNOS transistors 5a and 5b store data "0" and "1", respectively. When in this case the source voltage is rendered ON, the potential on the junction 9a is returned to 0V and the potential on the junction 9b to −15V. By holding the signal on the line 2 at the negative level the flip-flop circuit can be made to operate as an ordinary flip-flop circuit.

After at time t2 the source voltage is made completely stable, a pulse (hereinafter referred to as an erase signal) of +25 volts with a width of 1 m sec. is applied to the line 3 to cause both the MNOS transistors 5a and 5b to be set to the threshold voltage of +2V. By so doing the data of the flip-flop can be written in the MNOS transistor when the source voltage is again rendered OFF. Time t1 to t2 is a time period during which the flip-flop effects a normal operation. It will be sufficient if the erase signal is positioned between a read signal and a write signal.

As will be explained above, the readout of a data in the MNOS transistor into the flip-flop is effected in the time process in which the source voltage $V_{DD}$ is gradually increased to a stable level and the writing of the data in the flip-flop into the MNOS transistor is effected normally in the time process in which the source voltage is decreased from the stable level. If during such source voltage variation time the potential on the junction 9a as well as the potential on the junction 9b is subject to the influence of an unstable operation in a transition state of the source voltage of other circuit than a unit cell now in operation, the data transfer during the source voltage ON or OFF period is not desirably effected between the flip-flop and the MNOS transistor. When at the source voltage OFF time a data in the flip-flop is written into the MNOS transistors, since an access time to a memory cell including the flip-flop and MNOS transistors is below several microsecond, the data in the flip-flop is varied, while the data in the flip-flop is being written into the MNOS transistors, by a write pulse of 1 m sec width by an interference resulting from the unstable operation of other circuit than the unit cell now in operation which is caused by the variation of the source voltage. This sometimes makes the data per se in the MNOS transistors incorrect. The use of a cascade connection as disclosed in a non-volatile counter in U.S. patent application Ser. No. 509,490 automatically eliminates such a drawback. However, a serious problem occurs when the other form of circuit, for example, a non-volatile read/write random access memory is embodied. This often occurs with all the embodied memory devices adapted to effect a data transfer, at the power source ON or OFF time, between a non-volatile memory element and a volatile memory circuit. Restriction is therefore made on the wide application of the non-volatile memory elements.

It is accordingly the object of this invention to provide a random access memory system capable of, at a source voltage ON or OFF time, stably reading a data in a non-volatile memory element into a volatile memory element or stably writing the data in the volatile memory element into the non-volatile memory element, and capable of a highspeed read/write random access memory operation.

SUMMARY OF THE INVENTION

A random access non-volatile memory system according to this invention comprises a memory array circuit having a plurality of unit non-volatile memory cells arranged in a matrix array, each unit non-volatile memory cell including a volatile binary logic circuit and a non-volatile semiconductor memory element into which a data in the volatile binary logic circuit is written and from which the data written therein is transferred to the volatile binary logic circuit; cell selecting means including a decoder for decoding a plurality of address signal, and supplying the output of the decoder to the memory array circuit to select one of the unit memory cells; a data input-output circuit adapted to supply an input data to the selected unit memory cell and deliver a data read out of the unit memory cell; a voltage variation detector circuit adapted to detect the variation of a source voltage to the memory array circuit and generate a control signal for controlling, according to a detected output, a data transfer between the binary logic circuit and the non-volatile memory element; and means for interrupting in synchronism with control signal a data transfer path between selected unit memory cell and the input-output circuit.

BRIEF DESCRIPTION OF THE DRAWING

FIGS. 5A and 5B show a system according to one embodiment of this invention;

DETAILED DESCRIPTION OF THE PREFERRED EMBODIMENT

Figure 3:
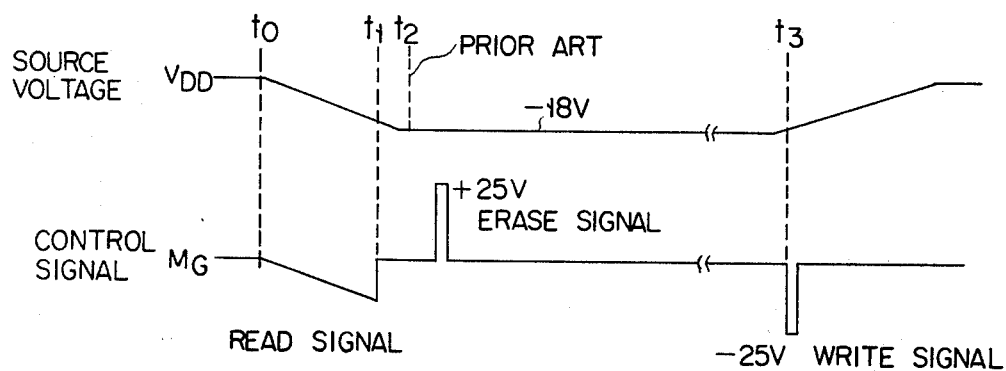
FIG. 3 shows a relation of a variation of a source voltage supplied to the circuit in FIG. 1, to a control signal corresponding to this variation.
Figure 4:
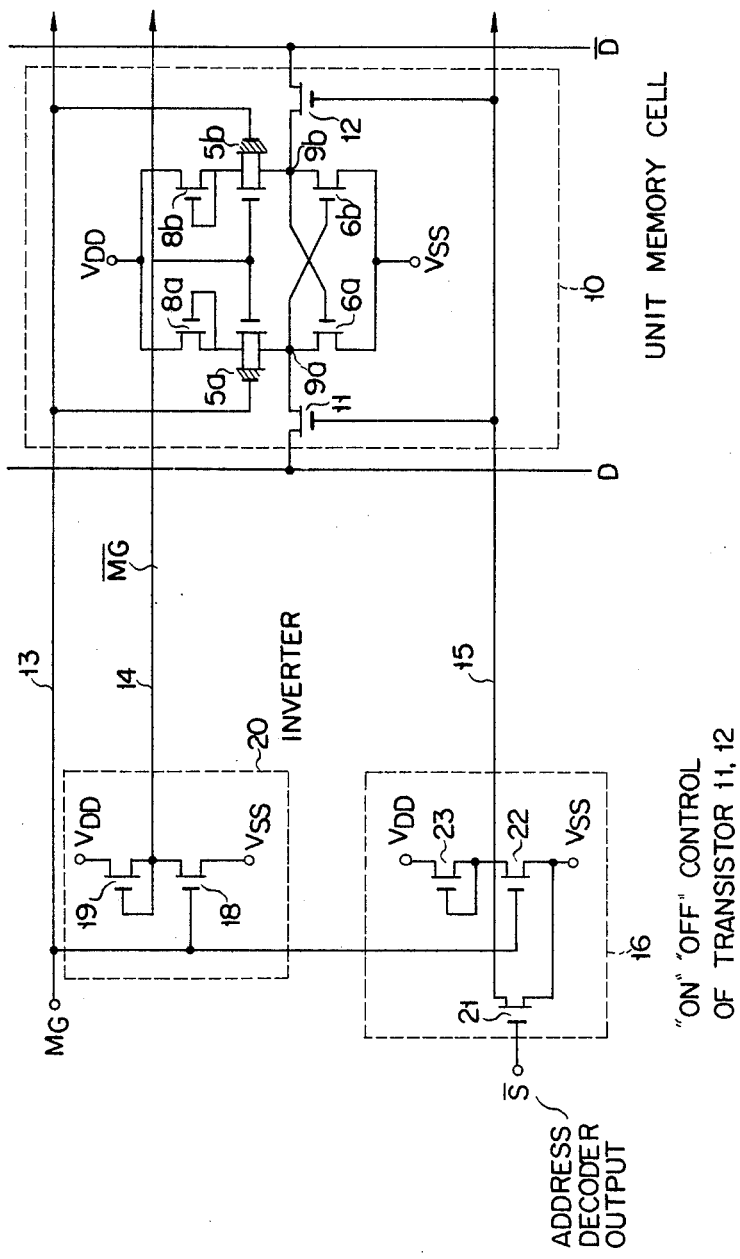
FIG. 4 shows the arrangement of a unit non-volatile memory cell applied to a system according to this invention and a control principle of the unit memory cell.

In FIG. 4 a unit non-volatile memory cell 10 is shown as including, in addition to the non-volatile memory cell, switching MOS transistors 11 and 12. Similar reference numerals are employed in this case to designate parts or elements corresponding to those shown in FIG. 1. Data lines D and $\bar{D}$ for the unit memory cell 10 are connected, respectively, through the switching MOS transistors 11 and 12 to junctions 9a and 9b. Lines 13 and 14 corresponds to the lines 3 and 4 and a control signal $\overline{M_G}$ is supplied to line 13. A signal $\overline{M_G}$ complementary to a signal $M_G$ is supplied to the line 14. The signal $\overline{M_G}$ is obtained by inverting the signal $M_G$ through an inverter 20 including MOS transistors 18 and 19. The control signal $M_G$ is responsive, like the signal $M_G$ in FIG. 3, to the variation of a source voltage $V_{DD}$. A line 15 is connected to the gate of the switching MOS transistors 11 and 12 and delivers the ON-OFF control signal of the switching MOS transistors 11 and 12. An ON-OFF control circuit 16 for the switching MOS transistors 11 and 12 comprises a parallel circuit of p-channel enhancement mode MOS transistors 21 and 22 having a threshold value of $-2V$ and a p-channel depletion mode MOS transistor 23 connected in series with the parallel circuit and having a threshold voltage of $+5V$. The gate of the transistor 22 is connected to a line 13; the drain of the transistor 23, to a source voltage $V_{DD}$; the source of the transistor 22, to a ground potential $V_{SS}$ and the junction between the transistors 22 and 23, to line 15. An output signal $\bar{S}$ of an address decoder not shown is applied to the gate of the transistor 21.

When a data (D, $\bar{D}$) is written into, and read out of, the unit memory cell, the signal $\bar{S}$ (=0V) is applied. Since a potential on the line 15 becomes negative when the signal $\bar{S}$ is applied, the switching MOS transistors 11 and 12 are rendered conductive. As a result, the data transfer is effected between the data lines D and $\bar{D}$ and the unit memory cell 10. In other words, only when the unit memory cell 10 is selected by the signal $\bar{S}$, the switching MOS transistors 11 and 12 are rendered conductive. As the control signal $M_G$ is applied to the gate of the MOS transistor 22, a potential on the line 15 is varied by the signal $M_G$ as well as the signal $\bar{S}$. As shown in FIG. 3, when the data transfer is effected between the flip-flop circuit and the MNOS transistors 5a and 5b, the signal $M_G$ becomes negative. With the signal $M_G$ at the negative potential level a potential on the line 15 becomes substantially equal to the ground potential $V_{SS}$, rendering the switching MOS transistors 11 and 12 nonconductive. The nonconductive operation is effected irrespective of the existence of the output signal $\overline{S}$ of the decoder. In other words, while the data transfer is being effected between the flip-flop circuit and the MNOS transistors 5a and 5b, the unit cell 10 are electrically separated from the data lines D and $\overline{D}$. Since the complementary signal of the signal $M_G$ is supplied to the line 14, a potential on the line 14 becomes substantially the ground potential $V_{SS}$ during the time in which a negative value signal $M_G$ is supplied to the unit memory cell. In consequence, the MOS transistors 7a and 7b are rendered non-conductive, a potential on the junction 9a as well as a potential on the junction 9b is not subjected to any influence from the source voltage $V_{DD}$.

As already set forth above, during the time period in which the data transfer is effected between the flip-flop circuit and the MNOS transistors the junctions 9a and 9b are entirely electrically independent of an external circuit. Since a potential on the junctions 9a and 9b is in an entirely stable state during the above-mentioned time period, a very reliable data can be written into the MNOS transistors 5a and 5b. It is also possible to stably transfer a data from the MNOS transistor to the flip-flop circuit.

One embodiment of this invention will be explained by referring to FIGS. 5A and 5B.

Figure 1:
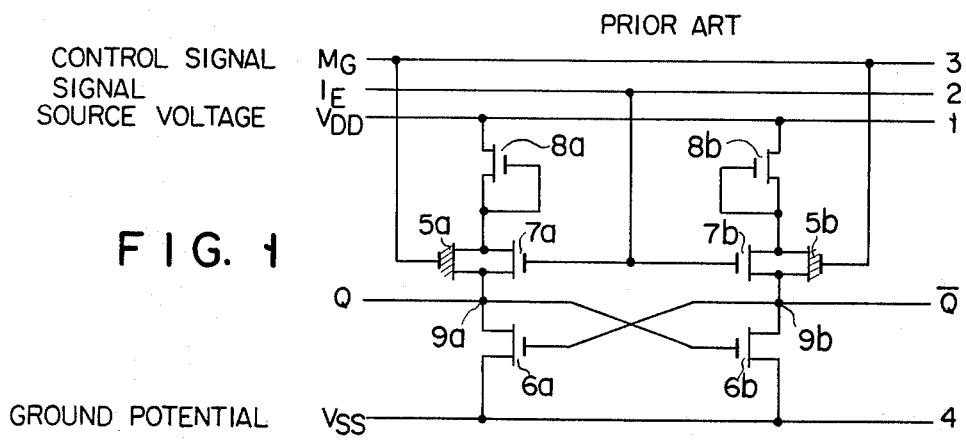
FIG. 1 shows a conventional non-volatile memory element by way of example.
Figure 2:
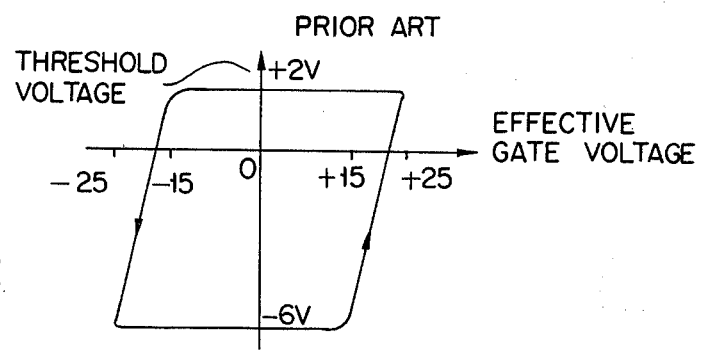
FIG. 2 shows by way of example a hysteresis characteristic of the threshold voltage of a MNOS type memory transistor as applied to a circuit in FIG. 1.

32 unit non-volatile memory cells 10 (only one is shown in FIG. 1) are arranged in a matrix array 16 in a row direction and 16 in a column direction to form a static type 256-bit random access memory array circuit. X- and Y-address decoders 25 and 26 are provided which are adapted to decode a plurality of address signals. A data input and output circuit 27, voltage variation detector circuit 28 and an on-off control circuit 29 for effecting the on-off control of switching transistors 11 and 12 are further provided. Lines to be connected to each unit memory cell 10 are shown to correspond to FIG. 4.

Figure 5B:
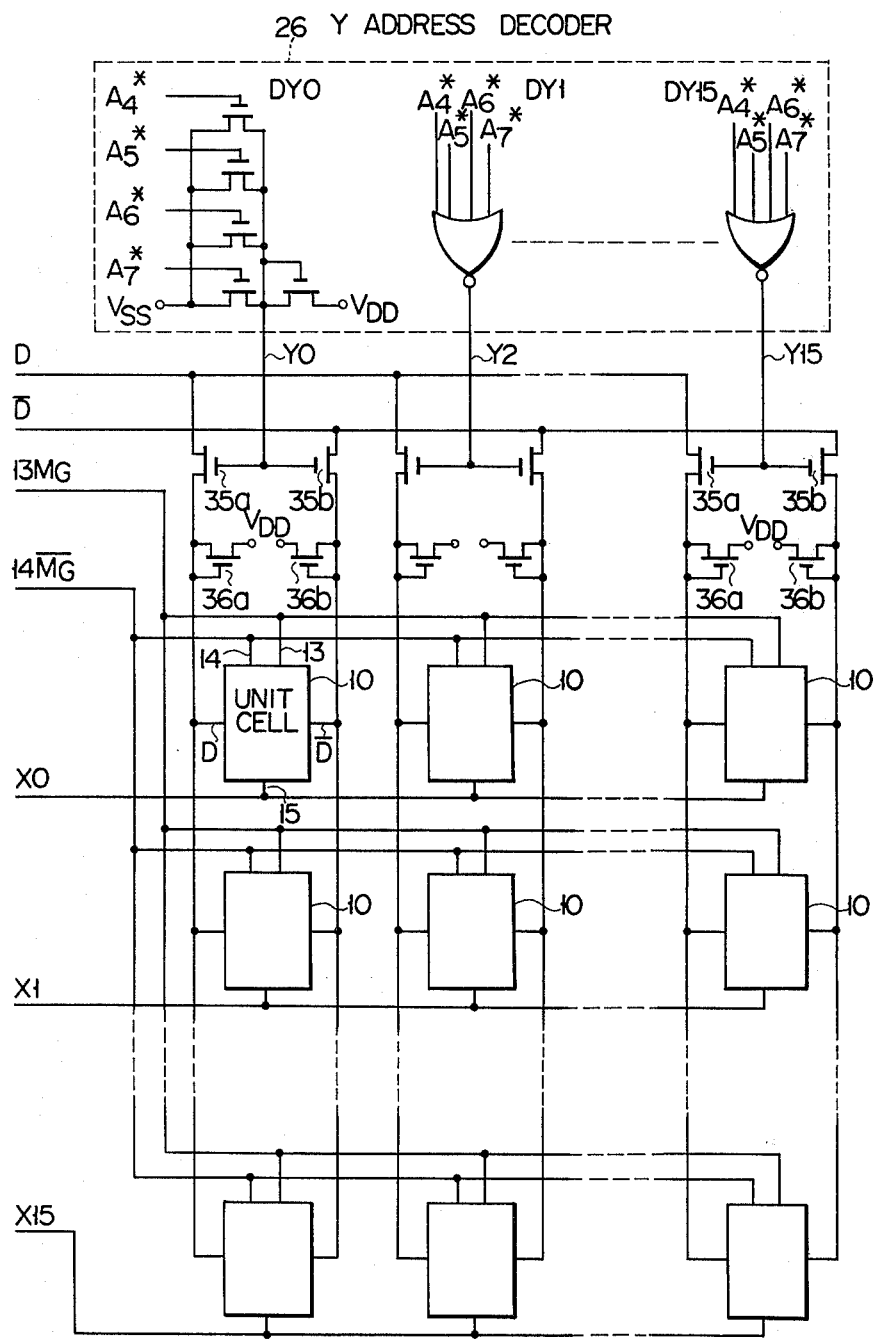

The on-off control circuit 29 in FIG. 5A is different in arrangement from the control circuit 21 in FIG. 4. The control circuit 29 includes an OR circuit comprising a NOR circuit having MOS transistors 30, 31, 32 and an inverter having MOS transistors 33 and 34, these circuit elements being connected as shown in FIG. 5A. An output signal $M_G$ of the voltage variation detection circuit 28 is supplied to the gate of the MOS transistor 30 and a chip select signal $\overline{C_S}$ is supplied to the gate of the MOS transistor 31. The OR circuit 29 supplies a logical sum $\overline{C_S} + M_G$ of the signals $\overline{C_S}$ and $M_G$ to the X-address decoder 25. The X-address decoder 25 includes 16 NOR circuit DX0 to DX15. The outputs X0 to X15 are each connected to the gate of switching MOS transistors 11 and 12 in a corresponding row of the matrix array. Of these NOR circuits the interior structure of the NOR circuit DX0 is representatively shown in FIG. 5B. A0, A1 . . . A3 represents address signals and the symbol A* in FIG. 5B means either an address signal A or an inverted signal A. Each NOR circuit includes 10 MOS transistors as shown in FIG. 5A. The signals $(\overline{C_S} + M_G)$ and A*0 to A*3 and voltages $V_{DD}$ and $V_{SS}$ are connected as shown in FIG. 5A. When the signal $(\overline{C_S} + M_G)$ on the line 35 is at the "1" level i.e. at the negative level, the outputs X0 to X15 are at the "0" level i.e. at the ground potential $V_{SS}$ and all the unit nonvolatile memory cell 10 is separated from an external circuit. That is, the switching transistors 11 and 12 and 7a and 7b are rendered non-conductive. The input and output circuit 27 has an input data line Din and output data line Dout at one side and input-output data lines D and $\overline{D}$ at the other side. The data line D is connected through a MOS transistor 35a to the drain of the switching MOS transistor 11 in the unit cell 10 in each column of the matrix array, and the data line $\overline{D}$ is connected through a MOS transistor 35b to the drain of the switching MOS transistor 12 in the unit cell 10 in each column of the matrix array. These data lines D and $\overline{D}$ are connected, as shown in FIG. 5B, to MOS transistors 36a and 36b.

On the other hand, the Y-address decoder 26 includes 16 NOR circuit DY0 to DY15. In FIG. 5B only one NOR circuit DY0 is shown in detail. That is, address signals A*4 to A*7 and voltages $V_{SS}$ and $V_{DD}$ are applied, as shown in FIG. 5B, to five MOS transistors. Outputs Y0 to Y15 are supplied to the gate of MOS transistors 35a and 35b which belong to the corresponding column. When address signals A*4 to A*7 are all at the "0" level, the MOS transistors 35a and 35b are rendered conductive. By a combination of the address signals A*0 to A*3, A*4 to A*7 and logic sum signals $(\overline{C_S} + M_G)$ one of the unit memory cells is selected and the data can be written into, and read out of, the cell now in consideration.

Figure 6:
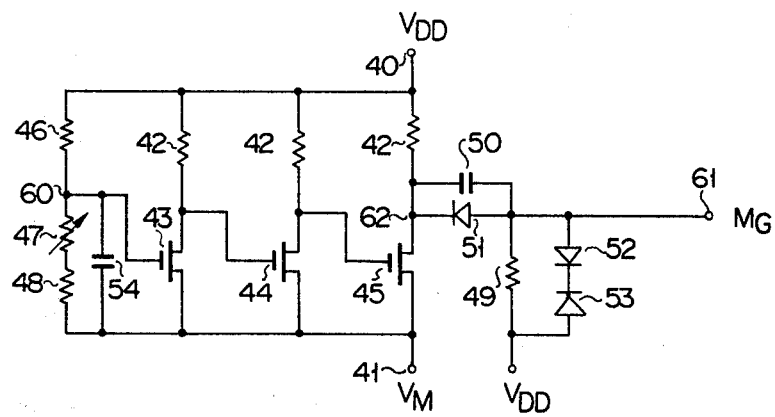
FIG. 6 is one form of a voltage variation detector in FIG. 5A.
Figure 7:
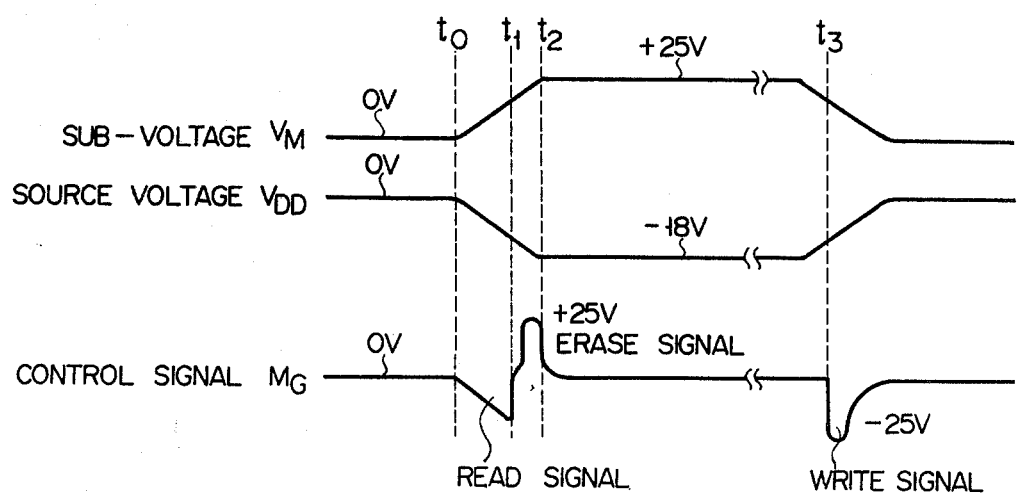
FIG. 7 shows a relation of input and output voltage waveforms in the circuit in FIG. 6.

FIG. 6 shows a source voltage variation detector circuit by way of example and FIG. 7 shows an input and output waveform in the detector circuit in FIG. 6. A source voltage $V_{DD}(=-18V)$ is applied to a terminal 40 and a subvoltage $V_N(=+25V)$ is supplied to a terminal 41. The subvoltage $V_M$ is controlled, in an ONOFF fashion, in synchronism with the source voltage $V_{DD}$. To the terminal 40 is connected one end of each of three resistors 42. The opposite ends of the resistors 42 are connected respectively through MOS transistors 43, 44 and 45 to the terminal 41. A combination of the resistors 42 and MOS transistors 43 to 45 constitutes an inventor. Between the terminal 41 are serially connected a resistor 46, variable resistor 47 and resistor 48. A junction 60 between the resistor 46 and the variable resistor 47 is connected to the gate of the MOS transistor 43. Between the junction 60 and the terminal 41 is connected a noise-preventing capacitor 54. A junction 62 between the resistor 42 and the MOS transistor 45 is coupled, through a diode 51 with a polarity indicated, to an output terminal 61 for a signal $M_G$. A diode 51 is connected in parallel with a capacitor 50. The output terminal 61 is held, through a resistor 49, at a ground voltage $V_{SS}$. Between a ground terminal $V_{SS}$ and the output terminal 61 are connected zener diodes 52 and 53 the cathodes of which are connected in common.

Suppose now that the threshold voltage of the MOS transistor 43 is $-4V$. If in this case a potential on the junction 60 is higher than $-4V$, the MOS transistor 43 is rendered conductive and if the potential on the junction 60 is lower than $-4V$, the MOS transistor 46 is rendered non-conductive. As shown in FIG. 7, when the source voltage $V_{DD}$ and sub-voltage $V_M$ are rendered ON at time $t0$, the potential on the terminal 40 and potential on the terminal 41 are varied toward $-18V$ and $+25V$, respectively. At time $t2$, these potentials are at a stable level. If the resistor 47 is set to a proper value, a potential on the junction 60 is lower, at time $t1$, than a threshold voltage $-4V$ of the MOS transistor 43, the MOS transistor 43 is rendered conductive. In consequence, the MOS transistor 45 is rendered conductive. At time $t0$ to $t1$ a control voltage $M_G$ goes to the negative potential substantially at the same inclination as that of a source voltage $V_{DD}$. At time $t_2$, the MOS transistor 45 is rendered conductive and a potential on the junction 62 becomes substantially equal to the sub-voltage $V_M$. That is, at time $t1$ to $t2$ the potential on the junction 62 is rapidly changed from a negative level to a positive level. Of the control signal $M_G$ a negative pulse generated at time $t0$ to $t1$ corresponds to the read signal in FIG. 3 and a positive pulse generated at time $t0$ to $t1$ corresponds to the erase signal in FIG. 3. The level of the erase signal does not exceed +25V by the presence of the zener diode 53 and the terminal 61 is held thereafter at the ground potential $V_{SS}$. When the source voltage $V_{DD}$ and sub-voltage $V_M$ are rendered OFF, a potential on the junction 60 is higher, at time $t3$ than the threshold voltage of the MOS transistor 43, the MOS transistor 43 is rendered nonconductive. Since the MOS transistor 45 is rendered nonconductive, a potential on the junction 62 is rapidly varied from the sub-voltage $V_M$ to the source voltage $V_{DD}$. The variation of the potential on the junction 62 appears, through the capacitor 50, as the variation of the potential on the junction 61 and at time $t3$ the terminal 61 is at a great negative potential. However, the presence of the zener diode restricts the potential on the terminal 61 to −25V. Since at time $t3$ et seq. the capacitor 50 is charged through the resistor 49 to the ground potential $V_{SS}$, the potential on the terminal 61 is again returned to the ground potential. A negative pulse at time $t3$ corresponds to the write signal in FIG. 3.

According to this invention, therefore, with the source voltage ON the data transfer is effected, at a stable state, from the non-volatile element to the flip-flop circuit and with the source voltage OFF the data transfer is effected, at a stable state, to the non-volatile element.

In the system according to this invention it is not necessarily required that with the source OFF the data transfer be effected from the flip-flop circuit to the nonvolatile element. At a predetermined portion of a time period in which the binary logic circuit is in a normal operative state a data in this binary logic circuit is written into the MNOS transistors $5a$ and $5b$ and, when the power source voltage $V_{DD}$ is rendered OFF and then ON, the data transfer can be effected from the MNOS transistors $5a$ and $5b$ to the logic circuit. In this case, a positive erasing pulse and the subsequent negative write pulse (first control signal) are supplied at a preset time to the line 13 (FIG. 4) and the data in the binary logic circuit is written into the MNOS transistors $5a$ and $5b$. When the power source voltage is rendered OFF and then ON, the ON time is detected at a voltage variation detector circuit (a modified form of the FIG. 6 circuit) and a readout signal (a second control signal) is supplied to the line 13 in FIG. 4 to cause the data in the MNOS transistors $5a$ and $5b$ to be transferred to the binary logic circuit. In this system, when in the selected unit memory cell the data transfer is effected between the binary circuit and the MNOS transistors $5a$, $5b$, the switching transistors 11 and 12 i.e. a data transfer path between the input-output circuit 27 and the selected unit memory cell are interrupted in synchronism with the second control signal.

What is claimed is:

1. A random access non-volatile memory system comprising:

a memory array circuit having a plurality of unit non-volatile memory cells arranged in a matrix array, each unit non-volatile memory cell including a volatile binary logic circuit and a non-volatile semiconductor memory element into which a data in the volatile binary logic circuit is written and from which the data written is transferred to the binary logic circuit;

cell selecting means including a decoder for decoding a plurality of address signals, and supplying the output of the decoder to the memory array circuit to select one of the unit memory cells;

a data input and output circuit supplying an input data to the selected unit memory cell and delivering a data read out of the unit memory cell;

a voltage variation detector circuit adapted to detect the variation of a source voltage supplied to the memory array circuit and generate a control signal for controlling, according to a detected output, a data transfer between the binary logic circuit and the non-volatile memory element; and means for interrupting in synchronism with the control signal a data transfer path between the selected unit memory cell and the input-output circuit.

2. The random access non-volatile memory system according to claim 1 in which said unit non-volatile cell includes two non-volatile memory elements, each non-volatile memory element is a MNOS (metal-nitride-oxide semiconductor) transistor having two threshold voltages varied according to its hysteresis characteristic; and said voltage variation detector circuit delivers a control signal including a. a readout signal for reading a data in the non-volatile memory element into the binary logic circuit when it detects a source ON time, b. a write signal for writing the data in the binary logic circuit into the non-volatile memory element when it detects a source OFF time, and c. an erase signal for setting a threshold voltage of each MNOS transistor to a value of the same sign at a time between the time when said readout signal is generated and the time when said write signal is generated.

3. The random access non-volatile memory system according to claim 1, in which said unit non-volatile memory cell includes a pair of series circuit each of which includes a driving MOS transistor having its source held at a ground potential, a load resistor device having one end to which a source voltage is supplied, and a parallel circuit consisting of a MNOS memory transistor connected between the drain of the driving MOS transistor and the other end of the load resistor device and a first switching MOS transistor, and a pair of second MOS transistors connected between the drain of said driving MOS transistor and a data line from said input-output circuit, in which a control signal from said voltage variation circuit is supplied to the gate of said MNOS memory transistors, an inverted one of said control signal is applied to the gate of the first switching MOS transistors at least at a time when data in the MNOS memory transistors are read, and a signal for interrupting said second switching MOS transistors in synchronism with the write and readout signals included in said control signal is supplied to the gate of said second switching MOS transistors.

4. A random access non-volatile memory system comprising:

a memory array circuit having a plurality of unit non-volatile memory cell arranged in a matrix array, each unit non-volatile memory cell including a volatile binary logic circuit and a non-volatile semiconductor memory element into which a data in the binary logic circuit is written and from which the data written therein is transferred to the binary logic circuit;

cell selecting means including a decoder for decoding a plurality of address signals and supplying the output of the decoder to the memory array circuit to select one of unit memory cells;

a data input-output circuit supplying an input data to the selected unit memory cell and delivering a data read out of the unit memory cell;

means for supplying to the memory cell a first control signal for writing a data in the logic circuit into the non-volatile memory element at a predetermined time during the operation of the binary logic circuit;

a voltage variation detector circuit adapted to detect an ON time when a source voltage to the memory cell array circuit is rendered OFF and then ON, and supply according to the detected output to the binary logic circuit a second control signal for transferring the data in the non-volatile element to the binary logic circuit; and means for interrupting in synchronism with the second control signal a data transfer path between the selected unit memory cell and the input-output circuit.

* * * * *